US009264013B2

(12) United States Patent
Zuo et al.

(10) Patent No.: US 9,264,013 B2
(45) Date of Patent: Feb. 16, 2016

(54) SYSTEMS FOR REDUCING MAGNETIC COUPLING IN INTEGRATED CIRCUITS (ICS), AND RELATED COMPONENTS AND METHODS

(71) Applicant: QUALCOMM Incorporated, San Diego, CA (US)

(72) Inventors: Chengjie Zuo, Santee, CA (US); Jonghae Kim, San Diego, CA (US); Daeik Daniel Kim, San Diego, CA (US); Mario Francisco Velez, San Diego, CA (US); Changhan Hobie Yun, San Diego, CA (US); Je-Hsiung Jeffrey Lan, San Diego, CA (US); Robert Paul Mikulka, Oceanside, CA (US); Matthew Michael Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 14/019,821

(22) Filed: Sep. 6, 2013

(65) Prior Publication Data
US 2014/0354372 A1 Dec. 4, 2014

Related U.S. Application Data

(60) Provisional application No. 61/830,718, filed on Jun. 4, 2013.

(51) Int. Cl.
*H03H 7/46* (2006.01)
*H03H 3/00* (2006.01)

(52) U.S. Cl.
CPC ............... *H03H 7/463* (2013.01); *H03H 3/00* (2013.01); *Y10T 29/4902* (2015.01)

(58) Field of Classification Search
CPC ........ H03H 7/463; H03H 3/00; Y10T 29/4902
USPC .......................................... 333/126–129, 132
See application file for complete search history.

(56) References Cited

U.S. PATENT DOCUMENTS 2,757,320 A 7/1956 Schuh, Jr.
3,656,162 A 4/1972 Mee
(Continued)

FOREIGN PATENT DOCUMENTS

DE 102006058068 A1 6/2008
EP 1411553 A1 4/2004
(Continued)

OTHER PUBLICATIONS

Co-pending U.S. Appl. No. 13/798,733, filed Mar. 13, 2013.
(Continued)

*Primary Examiner* — Robert Pascal
*Assistant Examiner* — Kimberly Glenn
(74) *Attorney, Agent, or Firm* — Withrow & Terranova, PLLC

(57) ABSTRACT

Systems for reducing magnetic coupling in integrated circuits (ICs) are disclosed. Related components and methods are also disclosed. The ICs have a plurality of inductors. Each inductor generates a magnetic flux that has a discernible axis. To reduce magnetic coupling between the inductors, the flux axes are designed so as to be non-parallel. In particular, by making the flux axes of the inductors non-parallel to one another, magnetic coupling between the inductors is reduced relative to the situation where the flux axes are parallel. This arrangement may be particularly well suited for use in diplexers having a low pass and a high pass filter.

19 Claims, 7 Drawing Sheets

(56) References Cited

U.S. PATENT DOCUMENTS

| | | | |
|---|---|---|---|
| 5,548,255 A * | 8/1996 | Spielman | 333/132 |
| 5,696,471 A | 12/1997 | Fujiwara | |
| 5,815,052 A | 9/1998 | Nakajima et al. | |
| 5,886,597 A | 3/1999 | Riad | |
| 6,180,976 B1 | 1/2001 | Roy | |
| 6,366,564 B1 | 4/2002 | Hiraka et al. | |
| 6,597,258 B2 | 7/2003 | Rosenbaum | |
| 6,597,315 B2 | 7/2003 | Yokoshima et al. | |
| 7,498,918 B2 | 3/2009 | Hsu et al. | |
| 7,564,319 B2 | 7/2009 | Ding et al. | |
| 7,586,755 B2 | 9/2009 | Satoh et al. | |
| 7,678,695 B2 | 3/2010 | Taniguchi et al. | |
| 7,821,359 B2 * | 10/2010 | Hart | 333/176 |
| 7,924,116 B2 | 4/2011 | Ono et al. | |
| 8,060,673 B2 | 11/2011 | Lu et al. | |
| 8,069,560 B2 | 12/2011 | Mori et al. | |
| 8,324,984 B2 | 12/2012 | Gavin et al. | |
| 8,339,233 B2 | 12/2012 | Tsai et al. | |
| 8,362,591 B2 | 1/2013 | Yen et al. | |
| 8,736,399 B2 * | 5/2014 | Solski et al. | 333/132 |
| 8,803,615 B2 | 8/2014 | Cabanillas et al. | |
| 2001/0044292 A1 * | 11/2001 | Jeon et al. | 455/334 |
| 2004/0124961 A1 | 7/2004 | Aoyagi | |
| 2004/0238644 A1 | 12/2004 | Leaming | |
| 2005/0240695 A1 | 10/2005 | Leaming | |
| 2008/0166980 A1 | 7/2008 | Fukamachi et al. | |
| 2009/0219908 A1 | 9/2009 | Rofougaran | |
| 2009/0225525 A1 | 9/2009 | Mano et al. | |
| 2009/0280865 A1 | 11/2009 | Danis et al. | |
| 2010/0095063 A1 | 4/2010 | Koraichi et al. | |
| 2010/0289126 A1 | 11/2010 | Pagaila et al. | |
| 2011/0095395 A1 | 4/2011 | Ellul et al. | |
| 2011/0110385 A1 * | 5/2011 | Gorostegui et al. | 370/497 |
| 2011/0248405 A1 | 10/2011 | Li et al. | |
| 2011/0291786 A1 * | 12/2011 | Li et al. | 336/200 |
| 2012/0075216 A1 | 3/2012 | Black et al. | |
| 2012/0080771 A1 | 4/2012 | Yang et al. | |
| 2012/0302188 A1 | 11/2012 | Sahota et al. | |
| 2013/0011995 A1 | 1/2013 | Watanabe | |
| 2013/0207745 A1 | 8/2013 | Yun et al. | |
| 2013/0223412 A1 | 8/2013 | Sambhwani | |
| 2014/0197902 A1 | 7/2014 | Zuo et al. | |
| 2014/0268616 A1 | 9/2014 | Lan et al. | |
| 2014/0327496 A1 | 11/2014 | Zuo et al. | |

FOREIGN PATENT DOCUMENTS

| | | |
|---|---|---|
| JP | S5291446 U | 7/1977 |
| JP | H0945866 A | 2/1997 |
| JP | 2002008942 A | 1/2002 |
| JP | 2003100553 A | 4/2003 |
| WO | 9923702 A1 | 5/1999 |
| WO | 2007061308 A1 | 5/2007 |
| WO | 2008069783 A1 | 6/2008 |
| WO | 2009118694 A1 | 10/2009 |
| WO | 2010107430 A1 | 9/2010 |
| WO | 2012144482 A1 | 10/2012 |

OTHER PUBLICATIONS

Buisman, Koen et al., "A Monolithic Low-Distortion Low-Loss Silicon-on-Glass Varactor-Tuned Filter with Optimized Biasing," IEEE Microwave and Wireless Components Letters, vol. 17, No. 1, Jan. 2007, IEEE, pp. 58-60.

International Search Report and Written Opinion for Patent Application No. PCT/US2014/040490, mailed Oct. 1, 2014, 15 pages.

Kim, Tae Wan et al., "A Compact Sized LTCC Diplexer with High-Band Selectivity and High Isolation for GSM and CDMA Multi-band Applications," 2009 APMC Microwave Conference, Dec. 2009, IEEE, pp. 2080-2083.

Liu, Kai et al., "Investigation of Integrated Passive Device with Through-Silicon Via," 2012 IEEE 62nd Electronic Components and Technology Conference (ECTC), May 29-Jun. 1, 2012, IEEE, pp. 1833-1839.

Methot F., "Constant Impedance Bandpass and Diplexer Filters," RF Design, vol. 9, No. 11, Nov. 1986, Primedia Business Magazine and Media, 3 pages.

Saitou, K. et al., "Tunable Duplexer Having Multilayer Structure Using LTCC," 2003 IEEE MTT-S International Microwave Symposium Digest, Jun. 8-13, 2003, Philadelphia, PA, IEEE, pp. 1763-1766.

Sakhnenko S., et al., "Ultra-Low-Profile Small-Size LTCC Front-End Module (FEM) for WLAN Applications Based on a Novel Diplexer Design Approach," IEEE MTT-S International Microwave Symposium Digest, Jun. 7-12, 2009, IEEE, pp. 609-612.

Sridharan, Vivek et al., "Design and Fabrication of Bandpass Filters in Glass Interposer with Through-Package-Vias (TPV)," 2010 Proceedings 60th Electronic Components and Technology Conference (ECTC), Jun. 1, 2010, IEEE, pp. 530-535.

Sun, Liguo et al., "System Integration Using Silicon-Based Integrated Passive Device Technology," 2012 IEEE International Symposium on Radio-Frequency Integration Technology (RFIT), Nov. 21-23, 2012, IEEE, pp. 98-100.

Vitale W.A., et al., "High-Q 3D Embedded Inductors Using TSV for RF MEMS Tunable Bandpass Filters (4.65-6.8 GHz)," IEEE European Microwave Integrated Circuits Conference, Oct. 29-Nov. 1, 2012, IEEE, pp. 822-825.

Buisman, et al., ""Distortion-Free" Varactor Diode Topologies for RF Adaptivity," 2005 IEEE MTT-S International Microwave Symposium Digest, 2005, pp. 157-160.

Second Written Opinion for Patent Application No. PCT/US2014/040490, mailed Jun. 11, 2015, 10 pages.

Shariff D., et al., "Integration of fine-pitched Through-Silicon Vias and Integrated Passive Devices", IEEE 61st Electronic Components and Technology Conference (ECTC), May 31-Jun. 3, 2011, Lake Buena Vista, FL, IEEE, pp. 844-848.

International Preliminary Report on Patentability for Patent Application No. PCT/US2014/040490, mailed Sep. 16, 2015, 19 pages.

* cited by examiner

SYSTEMS FOR REDUCING MAGNETIC COUPLING IN INTEGRATED CIRCUITS (ICS), AND RELATED COMPONENTS AND METHODS

PRIORITY APPLICATION

The present application claims priority to U.S. Provisional Patent Application Ser. No. 61/830,718 filed on Jun. 4, 2013 and entitled "SYSTEMS FOR REDUCING MAGNETIC COUPLING IN INTEGRATED CIRCUITS (ICs) AND RELATED COMPONENTS AND METHODS," which is incorporated herein by reference in its entirety.

RELATED APPLICATIONS

The present application is related to U.S. Provisional Patent Application Ser. No. 61/751,539 filed on Jan. 11, 2013 and entitled "DIPLEXER DESIGN USING THROUGH GLASS VIA TECHNOLOGY," which is incorporated herein by reference in its entirety.

The present application is also related to the utility conversion of the '539 application, namely U.S. patent application Ser. No. 13/798,733, filed on Mar. 13, 2013, and entitled "DIPLEXER DESIGN USING THROUGH GLASS VIA TECHNOLOGY," which is also incorporated herein by reference in its entirety.

BACKGROUND

I. Field of the Disclosure

The technology of the disclosure relates generally to integrated circuits (ICs), and particularly to reducing magnetic coupling between components in an IC.

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The competition for space for components and other factors contribute to a continued miniaturization of components within the circuitry.

Miniaturization of the components impacts all aspects of the processing circuitry including the memory transistors and other reactive elements in the processing circuitry. While miniaturization of components in mobile communication devices is easy for the consumer to appreciate as phones become smaller and lighter and have longer battery times, miniaturization pressures are not limited to mobile communication devices. Other computing devices such as desktop computers also try to increase available memory and processing power through miniaturization.

Concurrently with the miniaturization goals, the wireless communication industry continues to work towards providing as much bandwidth to consumers as possible. To this end, many wireless carriers have adopted carrier aggregation policies for current generation communications. That is, a wireless carrier such as AT&T® may own rights to two frequency bands (e.g., around 700 MHz and 2 GHz) in a particular geographic area. To maximize available bandwidth, the wireless carrier may use both frequencies simultaneously for a single communication stream. While using both frequency bands for a single communication stream does increase the amount of data that can be provided to the end user, there are complications in that each of the frequencies used to transmit data creates noise at the harmonic frequencies. In the AT&T® example, the 700 MHz transmissions create harmonics at 2.1 GHz that may interfere with data being broadcast at the 2 GHz frequencies. In such situations, a diplexer can be provided to process signals carried in a carrier aggregation system. In a chipset for a device using such a carrier aggregation system, the diplexer is usually inserted between an antenna and a tuner (or a radio frequency (RF) switch) to provide isolation between frequency bands to ensure high performance. Usually, a diplexer design includes inductors and capacitors for providing filtering. Diplexers can attain high performance by using inductors and capacitors that have a high quality (Q) factor. Diplexer performance may be quantified, by measuring the insertion loss and rejection (e.g., quantities expressed in decibels (dB)) at certain frequencies.

When miniaturization goals are applied to elements containing more than one inductor, such as diplexers, the inductors are frequently positioned in close proximity to each other. The close proximity of these inductors may result in magnetic coupling between the inductors. In most cases, this magnetic coupling results in a reduction in isolation and performance of the circuit.

SUMMARY OF THE DISCLOSURE

Embodiments disclosed in the detailed description include systems for reducing magnetic coupling in integrated circuits (ICs). Related components and methods are also disclosed. Exemplary ICs disclosed herein include a plurality of inductors. Each inductor generates a magnetic flux that has a discernible flux axis. To reduce magnetic coupling between the inductors, the flux axes are designed so as to be non-parallel to each other. In particular, by making the flux axes of the inductors non-parallel to one another, magnetic coupling between the inductors is reduced relative to the situation where the flux axes are parallel. This arrangement is particularly well suited for use in diplexers having a low pass and a high pass filter.

In this regard in one embodiment, a diplexer within a three dimensional (3D) IC (3DIC) is disclosed. The diplexer comprises a first inductor having a first flux axis and the first inductor comprises a 3D inductor. The diplexer also comprises a second inductor having a second flux axis where the first flux axis and the second flux axis are not parallel.

In another embodiment, a diplexer within a 3DIC is disclosed. The diplexer comprises a first means for providing inductance having a first flux axis. The diplexer also comprises a second means for providing inductance having a second flux axis where the first flux axis and the second flux axis are not parallel.

In another embodiment, a method of designing a diplexer in a 3DIC is disclosed. The method comprises placing a first inductor in the diplexer, wherein the first inductor has a first flux axis. The method also comprises placing a second inductor in the diplexer, wherein the second inductor has a second flux axis that is not parallel to the first flux axis so as to reduce magnetic coupling between the first inductor and the second inductor relative to a situation where the first and second flux axes are parallel.

DETAILED DESCRIPTION

Figure 1A:
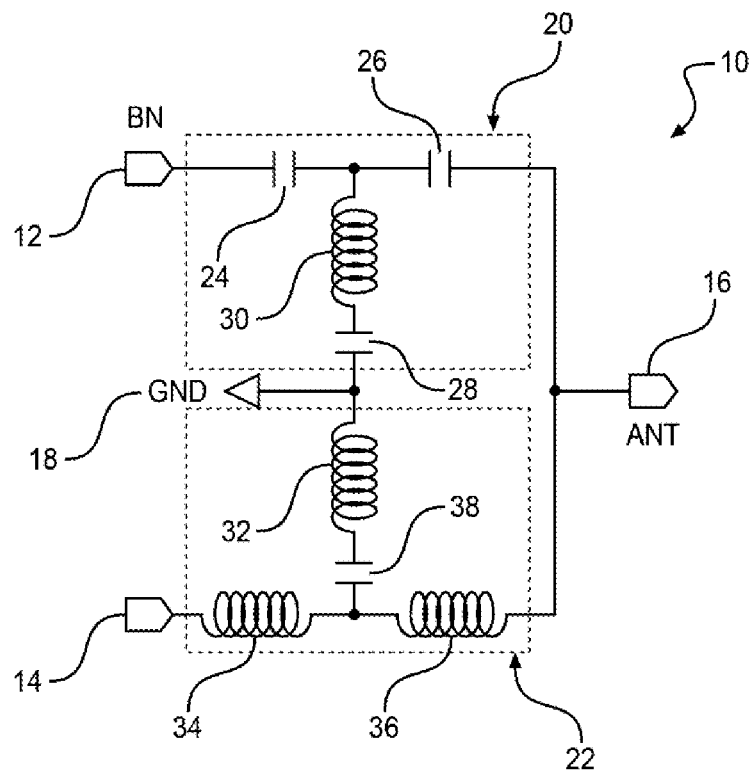
FIG. 1A is a schematic diagram of an exemplary conventional diplexer.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include systems for reducing magnetic coupling in integrated circuits (ICs). Related components and methods are also disclosed. The ICs have a plurality of inductors. Each inductor generates a magnetic flux that has a discernible axis. To reduce magnetic coupling between the inductors, the flux axes are designed so as to be non-parallel. In particular, by making the flux axes of the inductors non-parallel to one another, magnetic coupling between the inductors is reduced relative to the situation where the flux axes are parallel. This arrangement is particularly well suited for use in diplexers having a low pass and a high pass filter.

The advent of three dimensional (3D) IC (3DIC) allowed for a variety of circuit innovations, including 3D inductors. For example, in a diplexer having a low pass filter and a high pass filter, there may be several inductors (e.g., typically one or two per filter) and these are placed in relatively close proximity because of miniaturization pressures. Rejection in the band stop may be lessened if magnetic coupling occurs. If the rejection is lessened too much, the diplexer may be unable to meet design criteria. Unlike two dimensional (2D) inductors, which have an immutable flux axis that is fixed by the plane of the 2D inductor, 3D inductors may be selectively arranged during the design process to vary the relative orientations of the flux axes of the inductors relative to one another. In particular, by making the flux axes of the inductors non-parallel to one another, magnetic coupling between the inductors is reduced relative to the situation where the flux axes are parallel. The selective positioning of the inductors is well suited for use in a diplexer that should have minimal coupling between the inductors of the high pass filter and the inductors of the low pass filter.

Before addressing exemplary embodiments of ICs having the inductor layout of the present disclosure, a brief overview of some conventional diplexers and their frequency responses are provided with reference to FIGS. 1A-4. Embodiments of a 3DIC having multiple inductors with non-parallel flux axes according to exemplary embodiments of the present disclosure begin below with reference to FIG. 5.

In this regard, FIG. 1A is a schematic diagram of a conventional diplexer 10 that includes a first port 12, a second port 14, and an antenna port 16. An additional port to ground 18 may be provided. Between the first port 12 and the antenna port 16 is a high pass (HP) filter 20. Similarly, between the second port 14 and the antenna port 16 is a low pass (LP) filter 22. The HP filter 20 includes a first HP capacitor 24, a second HP capacitor 26, a third HP capacitor 28, and a HP inductor 30. Together, the third HP capacitor 28 and the HP inductor 30 define the notch frequency of the bandstop. Note that the inductors described herein are sometimes referred to as a means for inducting. Likewise, the capacitors described are sometimes referred to herein as means for providing capacitance.

With continued reference to FIG. 1A, the LP filter 22 includes a first LP inductor 32, a second LP inductor 34, a third LP inductor 36, and a LP capacitor 38. Together, the first LP inductor 32 and the LP capacitor 38 define the notch frequency of the bandstop.

Figure 1B:
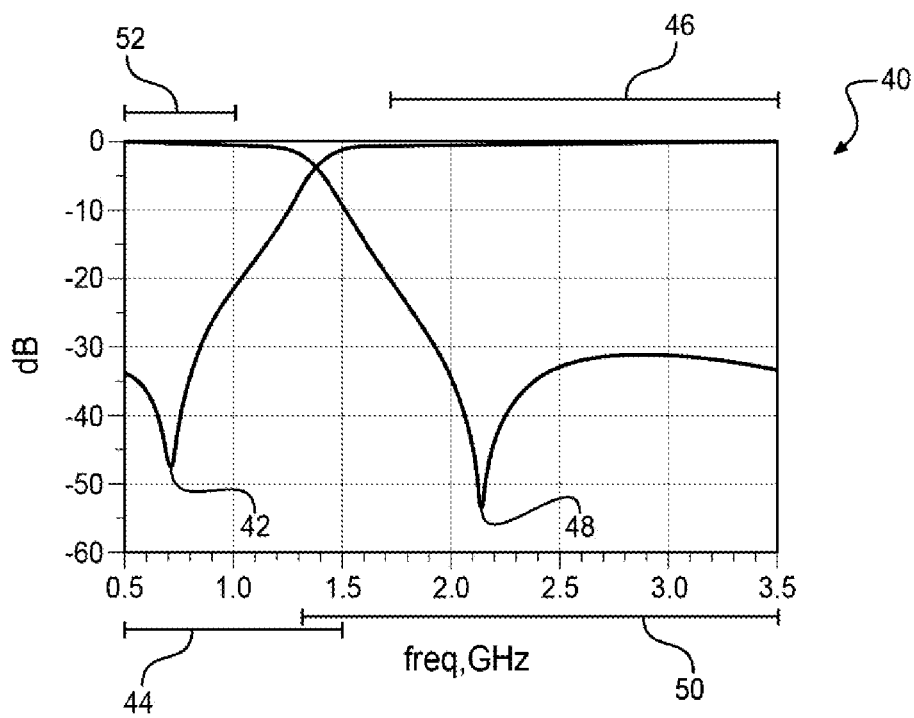
FIG. 1B is a graph of a typical frequency response for the diplexer of FIG. 1A.

A graph 40 of an exemplary frequency response from a "perfect" diplexer 10 of FIG. 1A is provided in FIG. 1B. As is readily seen, the HP filter 20 has a notch 42 at 710 MHz for the bandstop 44. The HP passband 46 begins at approximately 1.710 GHz. Likewise, the LP filter 22 has a notch 48 at 2.130 GHz for the bandstop 50. The LP passband 52 ends at about 1.040 GHz. Note that the graph 40 represents the "perfect" or ideal frequency response of the diplexer 10 with minimum magnetic coupling between active elements (e.g., between HP inductor 30 and first LP inductor 32). A more realistic situation where magnetic coupling occurs is explained below with reference to FIGS. 2-4.

Figure 1C:
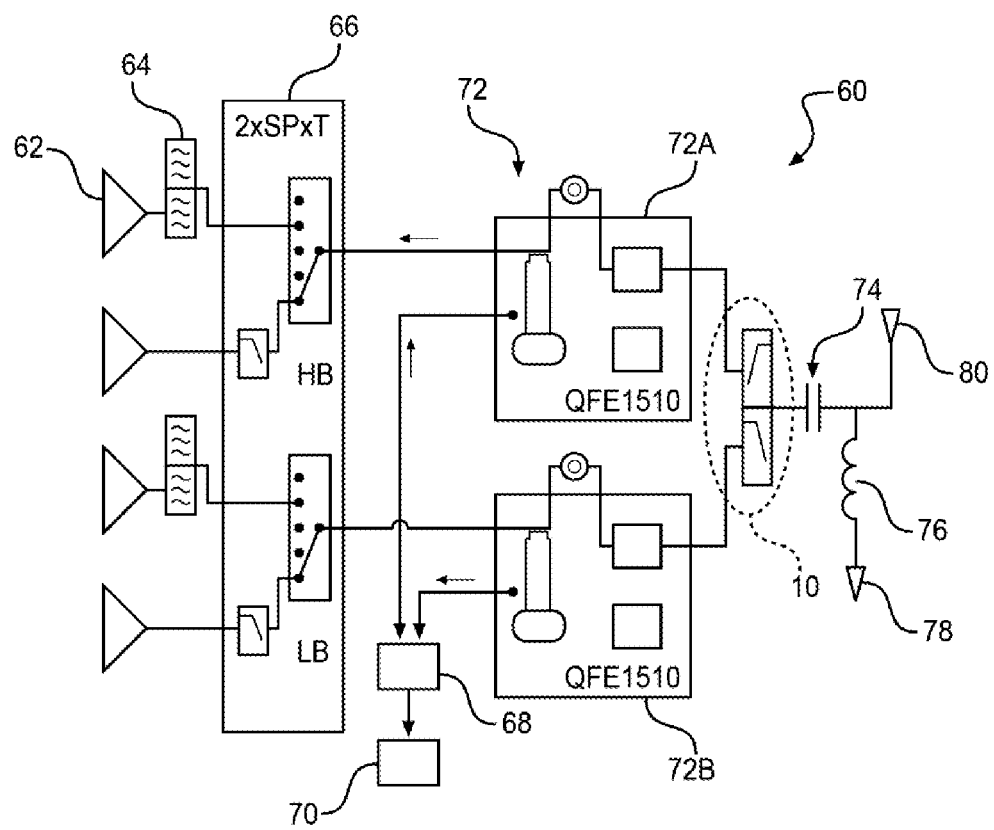
FIG. 1C is a schematic diagram of an exemplary radio transceiver employing a diplexer.

In the interest of completeness, it should be appreciated that a diplexer such as diplexer 10 may be positioned in a chip set 60 for a transceiver as illustrated in FIG. 1C. The chip set 60 includes a power amplifier 62, a duplexer/filter 64, a radio frequency (RF) switch module 66, a passive combiner 68, a receiver 70, a tuner circuitry 72 (e.g., a first tuner circuitry 72A and a second tuner circuitry 72B), a diplexer 10, a capacitor 74, an inductor 76, a ground terminal 78 and an antenna 80. The power amplifier 62 amplifies signal(s) to a certain power level for transmission. The duplexer/filter 64 filters the input/output signals according to a variety of different parameters, including frequency, insertion loss, rejection or other like parameters. The RF switch module 66 may select certain portions of the input signals to pass on to the rest of the chip set 60. The passive combiner 68 combines the detected power from the first tuner circuitry 72A and the second tuner circuitry 72B. The receiver 70 processes the information from the passive combiner 68 and uses this information to further operate the chip set 60. The tuner circuitry 72 includes components such as a tuner, a portable data entry terminal (PDET), and a housekeeping analog to digital converter (HKADC). The tuner circuitry 72 may perform impedance tuning (e.g., a voltage standing wave ratio (VSWR) optimization) for the antenna 80.

As shown in FIG. 1C, the diplexer 10 is between the tuner component of the tuner circuitry 72 and the capacitor 74, the inductor 76, and the antenna 80. The diplexer 10 may be placed between the antenna 80 and the tuner circuitry 72 to provide high system performance for the chip set 60. The diplexer 10 also performs frequency domain multiplexing on both high band frequencies and low band frequencies. After the diplexer 10 performs its frequency multiplexing functions on the input signals, the output of the diplexer 10 is fed to an optional LC network including the capacitor 74 and the inductor 76. The LC network may provide extra impedance matching components for the antenna 80, when desired. Then a signal with the particular frequency is transmitted or received by the antenna 80.

Figure 2:
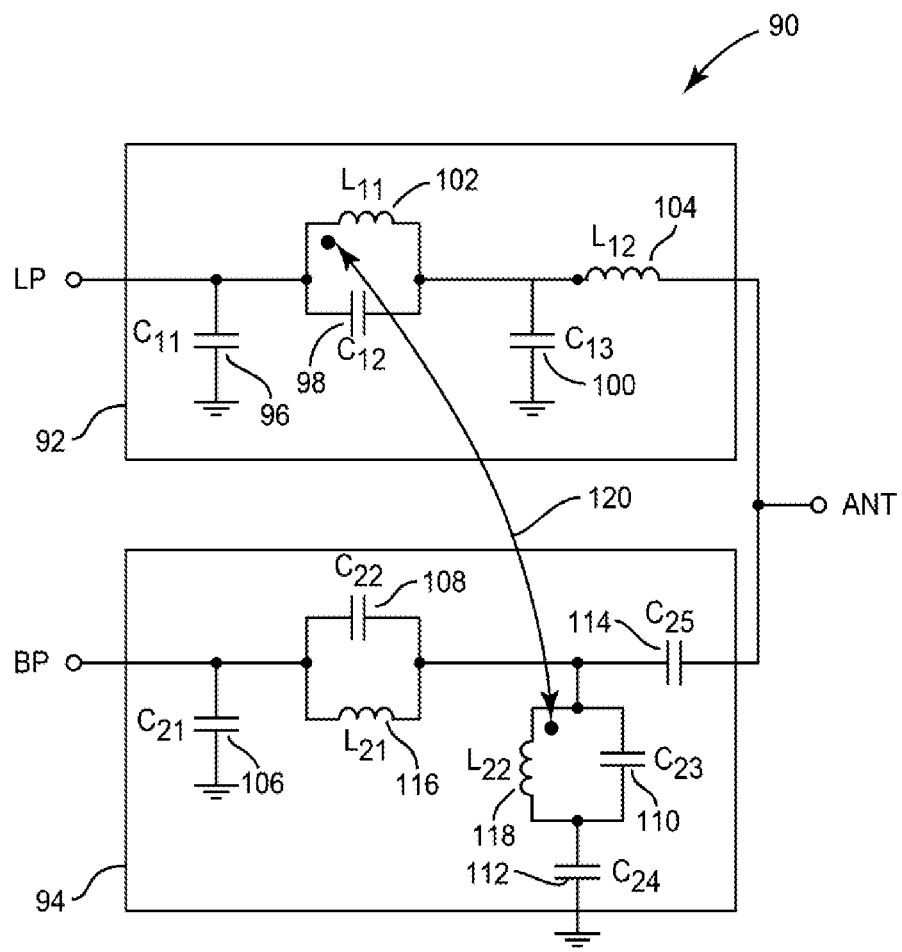
FIG. 2 is an alternate conventional diplexer design with the magnetic coupling between inductors highlighted.

While FIG. 1B reflects the frequency response of an ideal diplexer 10, FIG. 2 illustrates an alternate conventional diplexer 90. The diplexer 90 includes a LP filter 92 and a HP filter 94. The LP filter 92 includes a plurality of capacitors 96, 98, and 100 ($C_{11}$, $C_{12}$, and $C_{13}$ respectively) as well as a plurality of inductors 102, 104 ($L_{11}$, $L_{12}$ respectively). As with diplexer 10, LP filter 92 functions similarly to LP filter 22. The HP filter 94 includes a plurality of capacitors 106, 108, 110, 110, 112, and 114 ($C_{21}$, $C_{22}$, $C_{23}$, $C_{24}$, and $C_{25}$ respectively) as well as a plurality of inductors 116, 118 ($L_{21}$, $L_{22}$ respectively). As with diplexer 10, HP filter 94 functions similarly to HP filter 20. In a non-ideal situation, there is magnetic coupling between inductors in the LP filter 92 and inductors in the HP filter 94 as illustrated by magnetic coupling arrow 120 extending between inductor 102 ($L_{11}$) and inductor 118 ($L_{22}$). While a particular magnetic coupling is illustrated, other magnetic couplings may also exist between other inductors to a greater or lesser extent depending on relative proximity and size of inductors.

Figure 3:
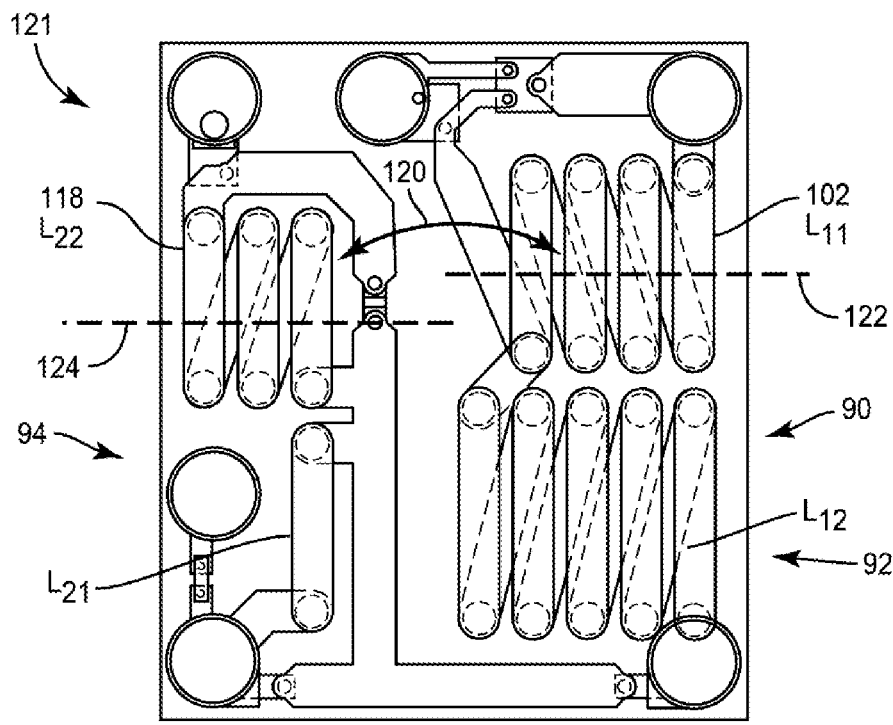
FIG. 3 is a top view of a three dimensional (3D) integrated circuit (IC) (3DIC) embodying the conventional diplexer design of FIG. 2 with the flux axes illustrated.

In this regard, FIG. 3 illustrates a top view of the diplexer 90 in a 3DIC 121. The inductors are 3D inductors, such as through glass via (TGV) inductors or through substrate via (TSV) inductors in general. For more information on TGV and TSV inductors, the interested reader is directed to U.S. Provisional Patent Application Ser. No. 61/751,539 filed on Jan. 11, 2013 and entitled "DIPLEXER DESIGN USING THROUGH GLASS VIA TECHNOLOGY," which is incorporated herein by reference in its entirety as well as the utility conversion of the '539 application, namely U.S. patent application Ser. No. 13/798,733, filed on Mar. 13, 2013, and entitled "DIPLEXER DESIGN USING THROUGH GLASS VIA TECHNOLOGY," which is also incorporated herein by reference in its entirety. While TSV inductors provide a Q of around thirty (30) or higher at 1 GHz, TGV inductors may provide a Q of greater than sixty (60) at 1 GHz. As is generally understood, inductors generate a magnetic field having a flux axis. For example, inductor 102 ($L_{11}$) generates a magnetic field having a flux axis 122. Likewise, inductor 118 ($L_{22}$) generates a magnetic field having a flux axis 124. Flux axis 122 is parallel to flux axis 124, allowing the magnetic coupling shown by arrow 120 between the inductors.

Figure 4:
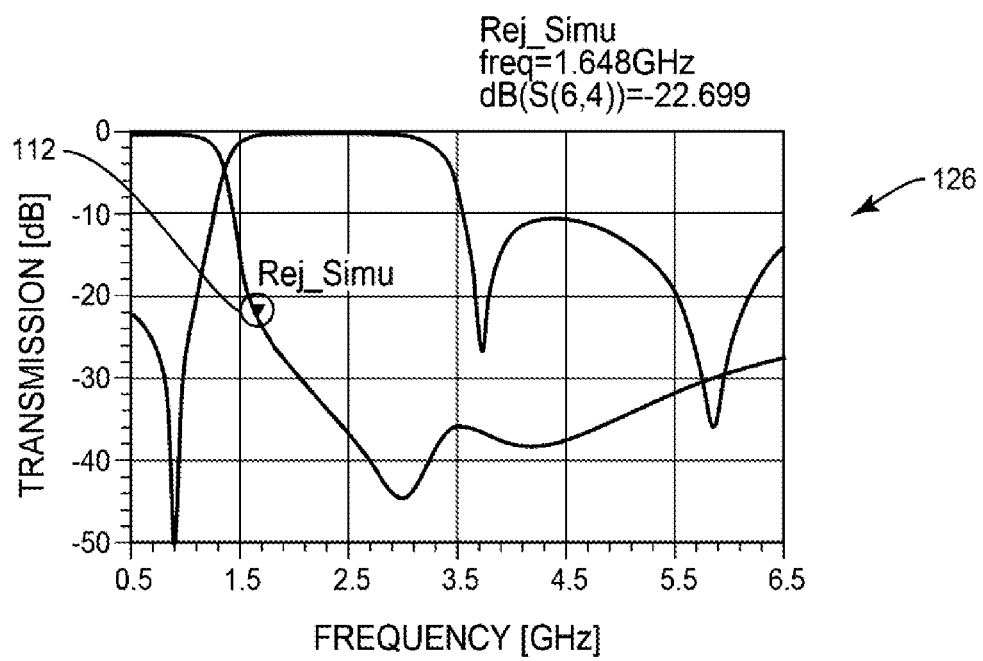
FIG. 4 is a graph of an exemplary frequency response of the conventional diplexer design of FIG. 3.

The magnetic coupling shown by arrow 120 between the inductors of the diplexer 90 affects the frequency response of the diplexer 90 as illustrated by graph 126 of FIG. 4. Of particular interest in FIG. 4, the rejection at 1.648 GHz (point 112) is only −22.699 dB. The specification for most cellular communication standards requires that the rejection be greater than 27 dB, and thus, the diplexer 90 fails to meet the specification. While the above discussion has focused on a diplexer having multiple inductors, it should be appreciated that other elements within a 3DIC (e.g., a matching circuit) may have 3D inductors and may have similar performance degradation as a function of magnetic coupling between parallel inductors.

In older 2D circuits, there was little that could be done to change the flux axes of the inductors. That is, each inductor was generally planar and had parallel flux axes (into or out of the plane of the circuit). Reduction of magnetic coupling was effectuated by spacing the inductors one from another. This spacing resulted in longer conductive paths and greater difficulty in circuit design.

The advent of 3DIC provides a new opportunity to solve the problem of magnetic coupling. In particular, the present disclosure teaches that the inductors within a 3DIC may be positioned so that the flux axes are non-parallel. By making the flux axes non-parallel, magnetic coupling is reduced.

Figure 5:
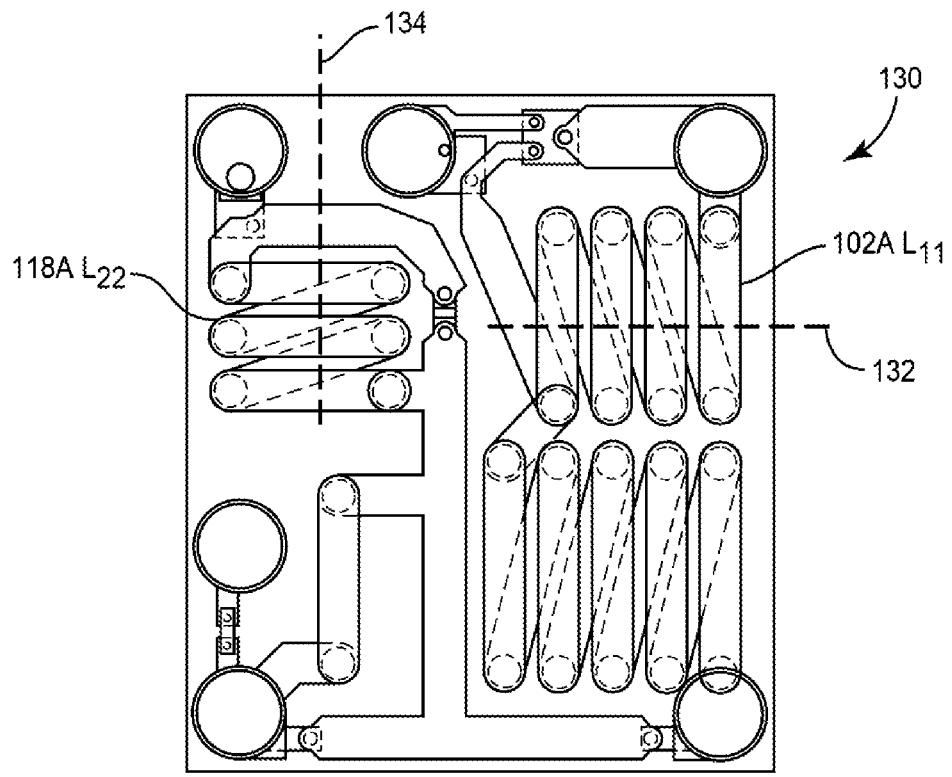
FIG. 5 is a top view of a 3DIC with diplexer circuit according to an exemplary embodiment of the present disclosure with the non-parallel flux axes illustrated.

In this regard, FIG. 5 illustrates a diplexer 130 having inductors that are non-parallel. For simplicity, the same basic circuit as diplexer 90 is used, but now, inductor 102A ($L_{11}$) is perpendicular to inductor 118A ($L_{22}$). Thus, the flux axis 132 of inductor 102A ($L_{11}$) is perpendicular to the flux axis 134 of inductor 118A ($L_{22}$). While the inductors are illustrated as being perpendicular, it should be appreciated that non-parallel angles between 45 degrees and 135 degrees have the highest degree of reduction in magnetic coupling. While some reduction is achieved between 0 and 45 degrees and 135 and 180 degrees, such reduction is considered sub-optimal.

Figure 6:
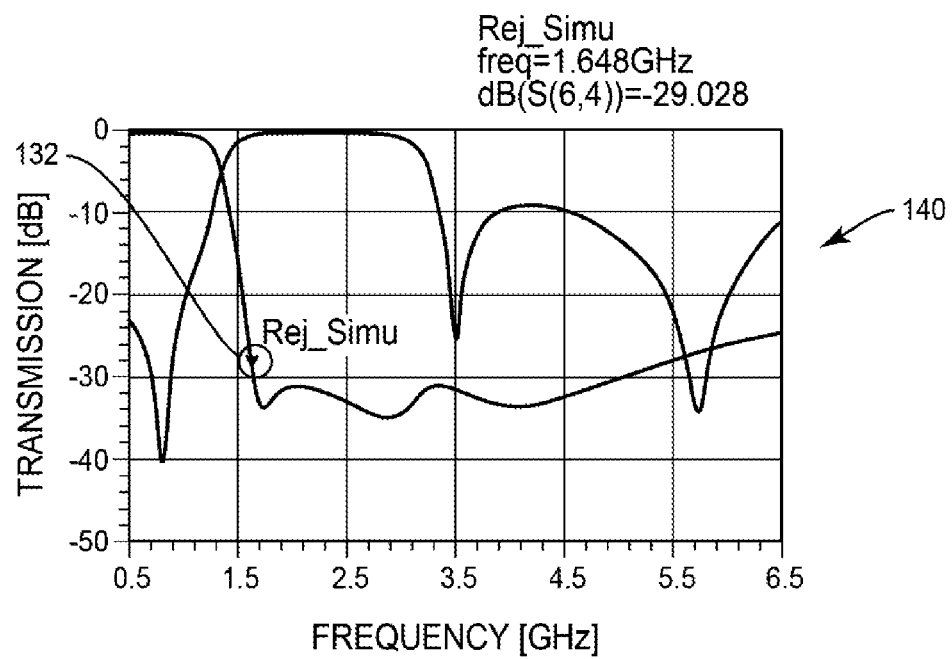
FIG. 6 is a graph of an exemplary frequency response of the diplexer of FIG. 5.

By placing the flux axes 132, 134 perpendicular to one another, a frequency response is produced as illustrated in graph 140 of FIG. 6. Now the rejection at 1.648 GHz (point 132) is −29.028 dB, which is a 6 dB improvement over the parallel inductors of diplexer 90 of FIG. 3 and meets the specification. Similar improvements in performance may be achieved in non-diplexer circuits such as impedance matching circuits or the like.

Figure 7:
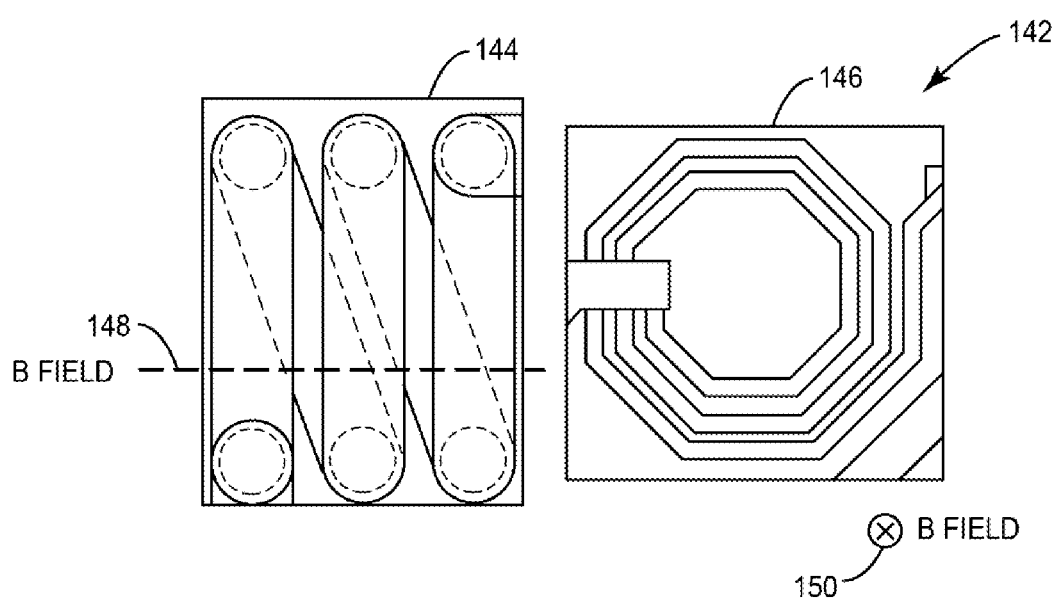
FIG. 7 is a top view of an alternate inductor arrangement according to an another embodiment of the present disclosure.

While the present disclosure has focused on improving the magnetic coupling between 3D inductors, similar reductions may be achieved by making one of the inductors a 2D inductor as illustrated by circuit 142 in FIG. 7. Thus, a first inductor 144 is a 3D inductor and a second inductor 146 is a 2D inductor. The first inductor 144 generates a magnetic field having an axis of flux 148 running from right to left as illustrated and the second inductor 146 generates a magnetic field having an axis of flux 150 that is perpendicular to the plane of the second inductor 146 (i.e., into or extending out of the page). In an exemplary embodiment, the first inductor 144 may be inductor $L_{11}$ and the second inductor 146 may be inductor $L_{22}$ within a diplexer 130. In other embodiments, the first inductor 144 may be one or more (but not all four) of the inductors $L_{11}$, $L_{12}$, $L_{21}$, $L_{22}$ within the diplexer 130.

The diplexers and related components and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
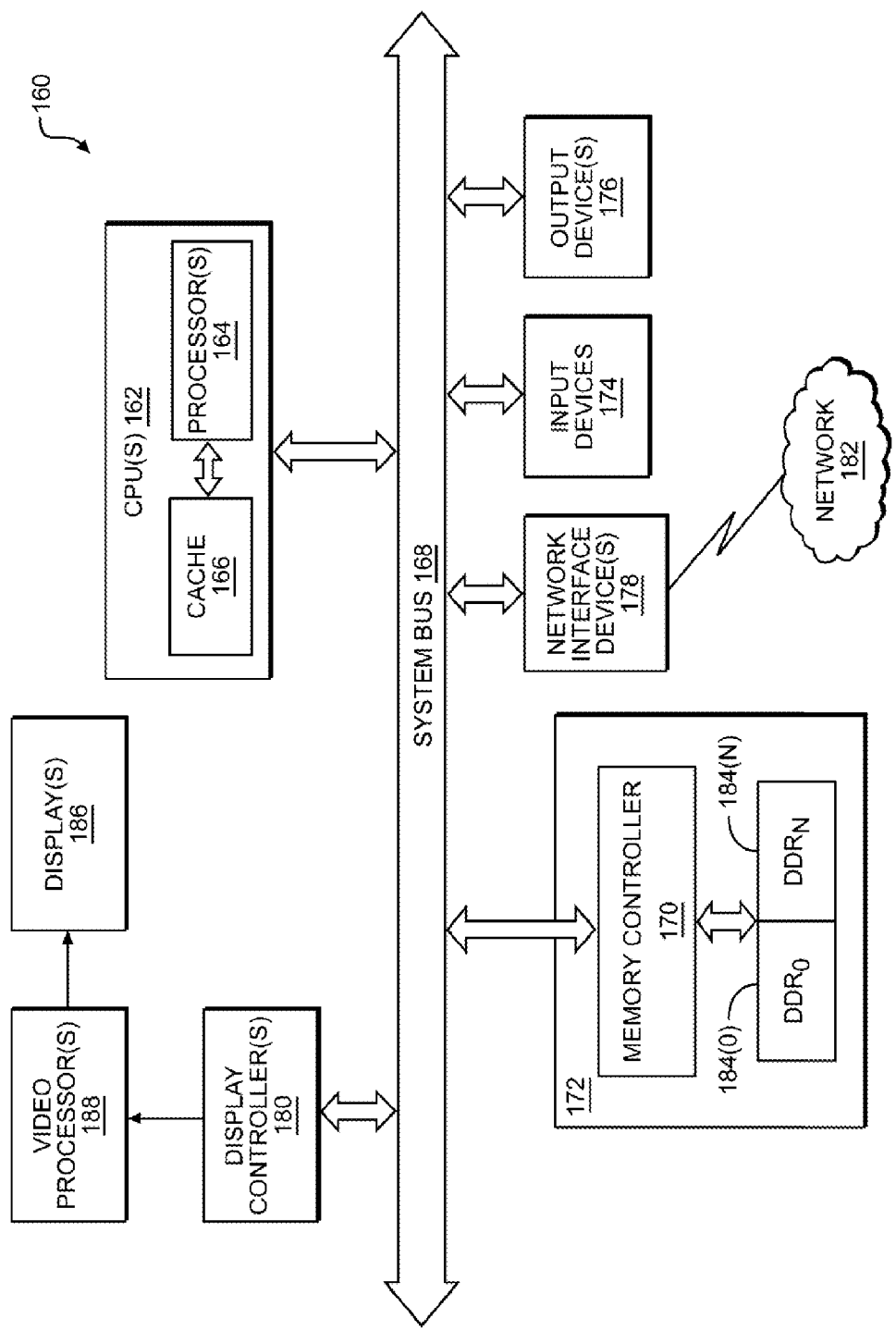
FIG. 8 is a block diagram of an exemplary processor-based system that can include the diplexer of FIG. 5.

In this regard, FIG. 8 illustrates an example of a processor-based system 160 that can employ diplexer 130 or circuit 142 illustrated in FIGS. 5 and 7. The diplexer 130 or circuit 142 may be incorporated into a semiconductor die or otherwise used in such a processor-based system 160. In this example, the processor-based system 160 includes one or more central processing units (CPUs) 162, each including one or more processors 164. The CPU(s) 162 may be a master device. The CPU(s) 162 may have cache memory 166 coupled to the processor(s) 164 for rapid access to temporarily stored data. The CPU(s) 162 is coupled to a system bus 168 and can intercouple master devices and slave devices included in the processor-based system 160. As is well known, the CPU(s) 162 communicates with these other devices by exchanging address, control, and data information over the system bus 168. For example, the CPU(s) 162 can communicate bus transaction requests to the memory controller 170 as an example of a slave device. Although not illustrated in FIG. 8, multiple system buses 168 could be provided, wherein each system bus 168 constitutes a different fabric.

Other master and slave devices can be connected to the system bus 168. As illustrated in FIG. 8, these devices can include a memory system 172, one or more input devices 174, one or more output devices 176, one or more network interface devices 178, and one or more display controllers 180, as examples. The input device(s) 174 can include any type of input device, including but not limited to input keys, switches, voice processors, etc. The output device(s) 176 can include any type of output device, including but not limited to audio, video, other visual indicators, etc. The network interface device(s) 178 can be any devices configured to allow exchange of data to and from a network 182. The network 182 can be any type of network, including, but not limited to, a wired or wireless network, private or public network, a local area network (LAN), a wide local area network (WLAN), and the Internet. The network interface device(s) 178 can be configured to support any type of communication protocol desired. The memory system 172 can include one or more memory units 184(0-N).

The CPU(s) 162 may also be configured to access the display controller(s) 180 over the system bus 168 to control information sent to one or more displays 186. The display controller(s) 180 sends information to the display(s) 186 to be displayed via one or more video processors 188, which process the information to be displayed into a format suitable for the display(s) 186. The display(s) 186 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A diplexer within a three dimensional (3D) integrated circuit (IC) (3DIC), comprising:
 a first inductor having a first flux axis wherein the first inductor comprises a through substrate via (TSV) 3D inductor; and
 a second inductor having a second flux axis where the first flux axis and the second flux axis are not parallel.

2. The diplexer of claim 1, wherein the second inductor comprises a two dimensional (2D) inductor.

3. The diplexer of claim 1, wherein the second inductor comprises a 3D inductor.

4. The diplexer of claim 1, wherein the first inductor comprises a through glass via (TGV) inductor.

5. The diplexer of claim 1, wherein the first flux axis and the second flux axis are perpendicular.

6. The diplexer of claim 1, wherein the first inductor is integrated into a low pass filter within the diplexer and the second inductor is integrated into a high pass or band pass filter within the diplexer.

7. The diplexer of claim 1 integrated into a semiconductor die.

8. The diplexer of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

9. A diplexer within a three dimensional (3D) integrated circuit (IC) (3DIC) comprising:
 a first means for providing inductance having a first flux axis, the first means for providing inductance comprising a through substrate via (TSV) 3D inductor; and
 a second means for providing inductance having a second flux axis where the first flux axis and the second flux axis are not parallel.

10. The diplexer of claim 9, wherein the first means for providing inductance comprises a through glass via (TGV) inductor.

11. The diplexer of claim 9, wherein the second means for providing inductance comprises a two dimensional (2D) inductor.

12. The diplexer of claim 9, wherein the second means for providing inductance comprises a 3D inductor.

13. The diplexer of claim 9, wherein the first flux axis and the second flux axis are perpendicular.

14. A method of designing a diplexer in a three dimensional (3D) integrated circuit (IC) (3DIC), comprising:
 placing a first inductor comprising a through substrate via (TSV) inductor in the diplexer, wherein the first inductor has a first flux axis; and
 placing a second inductor in the diplexer, wherein the second inductor has a second flux axis that is not parallel to the first flux axis so as to reduce magnetic coupling between the first inductor and the second inductor.

15. The method of claim 14, wherein placing the first inductor comprises placing a 3D inductor in the diplexer.

16. The method of claim 14, wherein placing the first inductor comprises placing a through glass via (TGV) inductor in the diplexer.

17. The method of claim 14, wherein placing the second inductor comprises placing a two dimensional (2D) inductor in the diplexer.

18. The method of claim 14, wherein placing the second inductor comprises placing a 3D inductor in the diplexer.

19. The method of claim 14, wherein not parallel comprises perpendicular.

\* \* \* \* \*